US010629655B2

(12) United States Patent
Bai et al.

(10) Patent No.: US 10,629,655 B2
(45) Date of Patent: Apr. 21, 2020

(54) ARRAY SUBSTRATE AND DISPLAY DEVICE HAVING OFFSET SUB-PIXEL ARRANGEMENTS

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Shanshan Bai, Beijing (CN); Fengli Ji, Beijing (CN); Minghua Xuan, Beijing (CN); Jiantao Liu, Beijing (CN); Jingbo Xu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 29 days.

(21) Appl. No.: 14/768,895

(22) PCT Filed: Jan. 16, 2015

(86) PCT No.: PCT/CN2015/070846
§ 371 (c)(1),
(2) Date: Aug. 19, 2015

(87) PCT Pub. No.: WO2016/050012
PCT Pub. Date: Apr. 7, 2016

(65) Prior Publication Data
US 2016/0254327 A1    Sep. 1, 2016

(30) Foreign Application Priority Data
Sep. 29, 2014 (CN) .......................... 2014 1 0515822

(51) Int. Cl.
*H01L 27/32* (2006.01)
*H01L 27/12* (2006.01)
(Continued)

(52) U.S. Cl.
CPC .......... *H01L 27/3218* (2013.01); *H01L 27/12* (2013.01); *H01L 27/3244* (2013.01);
(Continued)

(58) Field of Classification Search
CPC ............. H01L 27/3211; H01L 27/3218; H01L 27/3216
See application file for complete search history.

(56) References Cited

U.S. PATENT DOCUMENTS

2002/0109457 A1 * 8/2002 Duineveld .......... H01L 27/3218
313/504
2006/0017829 A1 * 1/2006 Gallagher .............. H04N 5/332
348/276
(Continued)

FOREIGN PATENT DOCUMENTS

CN    103123927 A    5/2013
CN    103208507 A    7/2013
(Continued)

OTHER PUBLICATIONS

International Search Report dated Jul. 1, 2015 issued in International Application No. PCT/CN2015/070846 along with the English translation of the Written Opinion.
(Continued)

*Primary Examiner* — Michael Jung
(74) *Attorney, Agent, or Firm* — Nath, Goldberg & Meyer; Joshua B. Goldberg; Stephanie Majkut

(57) ABSTRACT

The present invention provides an array substrate, a mask plate and a display device, relates to the field of OLED display technology, and can solve the problem that the array
(Continued)

substrate of an existing OLED has limited resolution because size of the openings and distance between openings cannot be too small. The array substrate of the present invention comprises a plurality of sub-pixels each having a light-emitting layer, wherein the sub-pixels are classified into a plurality of first type sub-pixels arranged in a matrix and second type sub-pixels each arranged between two adjacent first type sub-pixels in both row and column directions; and each second type sub-pixel and at least one first type sub-pixel adjacent thereto have the same color.

19 Claims, 3 Drawing Sheets

(51) Int. Cl.
*H01L 51/00* (2006.01)
*H01L 51/56* (2006.01)

(52) U.S. Cl.
CPC ........ *H01L 51/001* (2013.01); *H01L 51/0011* (2013.01); *H01L 51/56* (2013.01); *H01L 2227/323* (2013.01)

(56) References Cited

U.S. PATENT DOCUMENTS

| | | | |
|---|---|---|---|
| 2008/0001536 A1 | 1/2008 | Tsai et al. | |
| 2011/0260951 A1 | 10/2011 | Hwang et al. | |
| 2013/0027437 A1* | 1/2013 | Gu | G09G 3/3607 345/690 |
| 2013/0075744 A1 | 3/2013 | Shiobara et al. | |
| 2013/0106891 A1* | 5/2013 | Matsueda | G09G 3/2003 345/589 |
| 2013/0207215 A1* | 8/2013 | Otsuka | G02B 5/201 257/432 |
| 2015/0021637 A1* | 1/2015 | Ahn | H01L 27/3218 257/89 |
| 2015/0103103 A1* | 4/2015 | Kim | G09G 3/3233 345/690 |
| 2015/0138178 A1* | 5/2015 | Woo | G09G 3/3233 345/212 |
| 2015/0270317 A1* | 9/2015 | Lee | H01L 27/3218 257/40 |
| 2015/0311264 A1* | 10/2015 | Shen | H01L 27/3218 257/40 |
| 2015/0319822 A1* | 11/2015 | Yang | H01L 27/3218 362/231 |

FOREIGN PATENT DOCUMENTS

| | | |
|---|---|---|
| CN | 103898442 A | 7/2014 |
| CN | 104037201 A | 9/2014 |
| CN | 104037204 A | 9/2014 |
| TW | 200802296 A | 1/2008 |

OTHER PUBLICATIONS

1st office action issued in corresponding Chinese application No. 201410515822.3 dated Sep. 1, 2016.
The Extended European Search Report dated Apr. 26, 2018 corresponding to application No. 15791466A-1211.

* cited by examiner

ARRAY SUBSTRATE AND DISPLAY DEVICE HAVING OFFSET SUB-PIXEL ARRANGEMENTS

This is a National Phase Application filed under 35 U.S.C. 371 as a national stage of PCT/CN2015/070846, filed Jan. 16, 2015, an application claiming the benefit of Chinese Application No. 201410515822.3, filed Sep. 29, 2014, the content of each of which is hereby incorporated by reference in its entirety.

FIELD OF THE INVENTION

The present invention relates to the field of organic light-emitting diode (OLED) display technology, and particularly relates to an array substrate, a mask plate and a display device.

BACKGROUND OF THE INVENTION

Array substrate of an organic light-emitting diode (OLED) display device includes a plurality of sub-pixels, in each of which an OLED for emitting light of corresponding color is provided, the OLED includes a cathode, an anode and a light-emitting layer. The light-emitting layer mainly includes an electroluminescent layer (for the purpose of emitting light of different colors), and may also include other layers such as an electron transport layer, an electron injection layer, a hole injection layer, a hole transport layer, etc. The light-emitting layer is generally formed by way of evaporation. For sub-pixels having different colors, because materials of the light-emitting layers thereof are different, the light-emitting layers thereof need to be formed separately by way of evaporation, that is, the light-emitting layers of the same color may be simultaneously formed by way of evaporation. In forming the light-emitting layer of each color by way of evaporation, it is necessary to use a Fine Metal Mask (FMM), which is a metal sheet (thickness thereof is typically 30-40 μm) with many openings, the openings correspond to positions where the light-emitting layers need to be formed, and thus evaporation material (material of the light-emitting layers) can only be evaporated and formed at the desired positions through the openings, without entering into sub-pixels of other colors.

With the development of technology, resolution of a display device is continuously improved, and therefore sizes of the sub-pixel and structures therein are continuously decreased. For a FMM, due to the limitation of technique and performance of material, size of the openings and distance between openings cannot be too small, which limit the smallest size of the light-emitting layer, thereby impacting improvement of resolution.

SUMMARY OF THE INVENTION

Embodiments of the present provide an array substrate with higher resolution, a mask plate and a display device.

One embodiment of the present invention includes an array substrate, which comprises a plurality of sub-pixels each having a light-emitting layer, wherein the sub-pixels comprise a plurality of first type sub-pixels arranged in a matrix and second type sub-pixels, wherein each second type sub-pixel is arranged between two adjacent first type sub-pixels in both row and column directions; and each second type sub-pixel and at least one first type sub-pixel adjacent thereto have the same color.

In one embodiment, there are some first type sub-pixels, each of which has the same color as one first type sub-pixel in adjacent row and adjacent column thereof, and no second type sub-pixel is provided between the two first type sub-pixels.

In one embodiment, the array substrate includes a plurality of repetitive units arranged in an array, each repetitive unit comprising eight first type sub-pixels and four second type sub-pixels arranged in the following manner:

| first type sub-pixel | | first type sub-pixel |
|---|---|---|
| | second type sub-pixel | |
| first type sub-pixel | | first type sub-pixel |
| | second type sub-pixel | |
| first type sub-pixel | | first type sub-pixel |
| | second type sub-pixel | |
| first type sub-pixel | | first type sub-pixel |
| | second type sub-pixel. | |

In one embodiment, the 12 sub-pixels included in each repetitive unit comprises four first color sub-pixels, four second color sub-pixels and four third color sub-pixels; and in the array substrate, among the sub-pixels in the same column, sub-pixels having the same color are not adjacent; and among the sub-pixels in the same row, sub-pixels having the same color are not adjacent.

In one embodiment, in each repetitive unit, the first color sub-pixels, the second color sub-pixels and the third color sub-pixels are arranged in the following manner:

| first color sub-pixel | | second color sub-pixel |
|---|---|---|
| | third color sub-pixel | |
| third color sub-pixel | | first color sub-pixel |
| | second color sub-pixel | |
| second color sub-pixel | | third color sub-pixel |
| | first color sub-pixel | |
| third color sub-pixel | | first color sub-pixel |
| | second color sub-pixel. | |

In one embodiment, projection of the light-emitting layer of each second type sub-pixel along the column direction is partially overlapped with projections, along the column direction, of the light-emitting layers of two columns of first type sub-pixels adjacent to said second type sub-pixel, respectively; and projection of the light-emitting layer of each second type sub-pixel along the row direction is partially overlapped with projections, along the row direction, of the light-emitting layers of two rows of first type sub-pixels adjacent to said second type sub-pixel, respectively.

In one embodiment, each light-emitting layer is in the shape of a parallelogram, and each side of the parallelogram is inclined with respect to the row and column directions.

In one embodiment, the light-emitting layer of each second type sub-pixel has two opposite sides, which are respectively in the same lines with two opposite sides of the light-emitting layer of the first type sub-pixel having the same color as and adjacent to said second type sub-pixel.

In one embodiment, all light-emitting layers are in the shape of rhombuses, and every rhombus has one pair of sides parallel to a first direction and the other pair of sides parallel to a second direction.

A technical solution used to solve the technical problem of the present invention includes a mask plate for forming light-emitting layers in the above-described array substrate by way of evaporation; the mask plate includes a plate body provided with a plurality of openings, the plurality of openings are configured to correspond to positions of the light-emitting layers of sub-pixels having the same color in the array substrate, and the light-emitting layers of two sub-pixels having the same color and adjacent to each other correspond to one opening.

A technical solution used to solve the technical problem of the present invention includes a display device, comprising:

the above-described array substrate.

In the array substrate provided by the present invention, with the arrangement manner of the sub-pixels a better display effect can be achieved. Meanwhile, in the array substrate, at least some of the sub-pixels adjacent in an inclined direction have the same color, and therefore, the light-emitting layers (at least the electroluminescent layers) thereof can be formed through one opening in the mask plate, and in this way, size of the sub-pixel formed by using the mask plate can be smaller (one opening corresponds to two sub-pixels, i.e., the size of one sub-pixel is a half of that of the opening), under the circumstance that the allowable smallest size of openings in the mask plate is fixed, thereby further improving resolution of the array substrate.

DETAILED DESCRIPTION OF THE EMBODIMENTS

To enable a person skilled in the art to better understand the technical solutions of the present invention, the present invention is described in detail below in conjunction with the accompanying drawings and specific implementations.

In the present invention, "row" and "column" are two directions perpendicular to each other, and the setting of "row" and "column" is independent of shape, arrangement manner, position and the like of a display device (array substrate). For ease of description, the horizontal direction in the accompanying drawings is referred to as row and the vertical direction is referred to as column.

Embodiment 1

This embodiment provides an array substrate, which comprises a plurality of sub-pixels each having a light-emitting layer, wherein the sub-pixels comprise a plurality of first type sub-pixels arranged in a matrix and second type sub-pixels, wherein each second type sub-pixel is arranged between two adjacent first type sub-pixels in both row and column directions; and each second type sub-pixel and at least one first type sub-pixel adjacent thereto have the same color.

Embodiment 2

This embodiment provides an array substrate, which comprises a plurality of sub-pixels having different colors (e.g., red sub-pixels, green sub-pixels and blue sub-pixels). In each sub-pixel, an organic light-emitting diode for emitting light whose color corresponds to the color of the sub-pixel is provided (i.e., the array substrate is an OLED array substrate). An OLED comprises a cathode, an anode and a light-emitting layer provided between the cathode and the anode. Materials of the light-emitting layers (at least electroluminescent layers) of the sub-pixels having different colors are different, so as to achieve the purpose of emitting light of different colors.

Accordingly, in each sub-pixel, known structures such as a thin film transistor (configured to drive the OLED), a pixel define layer (configured to partition light-emitting layers of different sub-pixels to allow the light-emitting layers of the respective sub-pixels to emit light independently) and the like may be provided, and therefore, size of the sub-pixel may be larger than that of the above-described light-emitting layer; in addition, gate lines, data lines and other known structures may be included in the array substrate, which are not described in detail herein.

Figure 2:
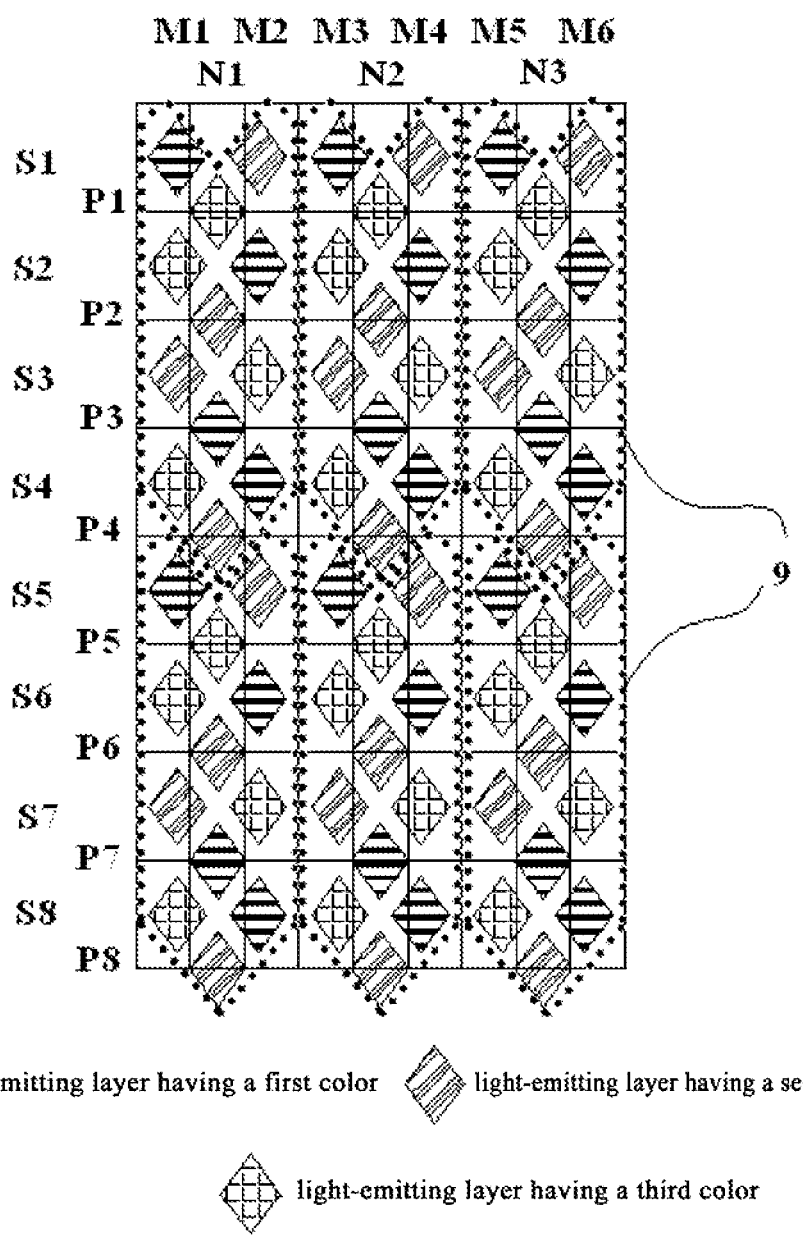
FIG. 2 is a structural schematic diagram of light-emitting layers of an array substrate provided by an embodiment of the present invention.

The sub-pixels of the array substrate are classified, according to the positions thereof, into first type sub-pixels and second type sub-pixels. As shown in FIG. 2, the first type sub-pixels are sub-pixels denoted by abscissa M and ordinate S (the sub-pixels are represented by light-emitting layers in the drawings), these first type sub-pixels are arranged in an standard matrix, i.e., are arranged in rows and columns perpendicular to each other. The second type sub-pixels are sub-pixels denoted by abscissa N and ordinate P. As shown in FIG. 2, the second type sub-pixel is between the adjacent first type sub-pixels in both row and column directions; that is to say, the second type sub-pixels are provided at "gaps" of the matrix in which the first type sub-pixels are arranged. For example, for the second type sub-pixel with coordinates (N1, P1), it is located between the first type sub-pixels with coordinates (M1, S1) and (M2, S1) in the row direction and between the first type sub-pixels with coordinates (M1, S1) and (M1, S2) in the column direction. Further, as shown in FIG. 2, it is not necessary to provide a second type sub-pixel between every adjacent first type sub-pixels, and therefore, the number of the second type sub-pixels may be smaller than the number of the first type sub-pixels.

In the array substrate provided by this embodiment, each second type sub-pixel and at least one first type sub-pixel adjacent thereto have the same color. That is to say, for each second type sub-pixel, among the four first type sub-pixels adjacent thereto in the row and column directions (i.e., four first type sub-pixels located at the top left, bottom left, top right, bottom right of the second type sub-pixel, respectively), at least one first type sub-pixel has the same color as the second type sub-pixel. Specifically, as shown in FIG. 2, for the second type sub-pixel with coordinates (N1, P1), it is adjacent to four first type sub-pixels whose coordinates are (M1, S1), (M2, S1), (M2, S2) and (M1, S2), respectively, and the first type sub-pixel with coordinates (M1, S2) and the second type sub-pixel with coordinates (N1, P1) both have the third color, and these two sub-pixels are the sub-pixels adjacent to each other and having the same color.

Figure 3:
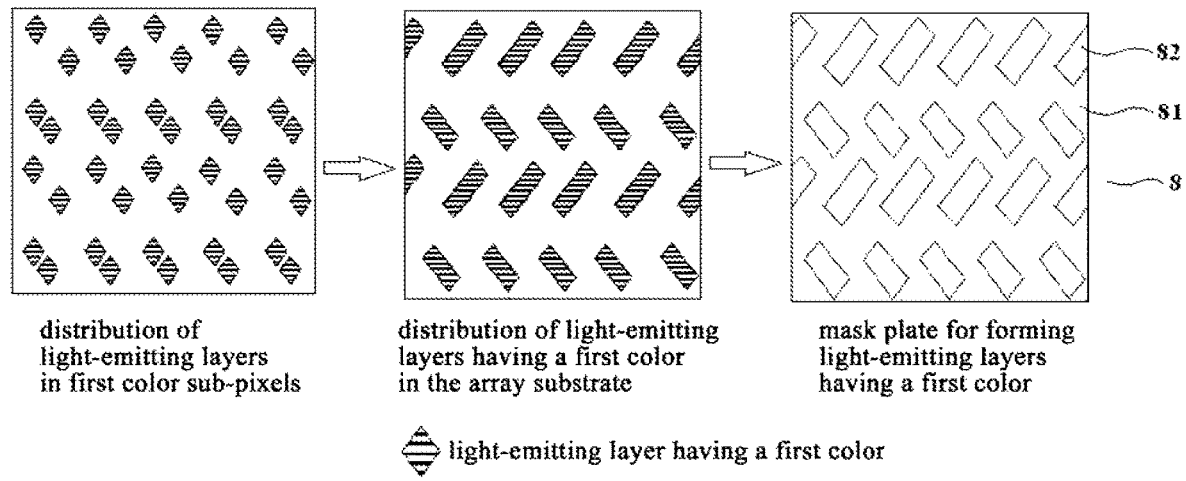
FIG. 3 are structural schematic diagrams of light-emitting layers having a first color in an array substrate and a corresponding mask plate provided by an embodiment of the present invention.
Figure 4:
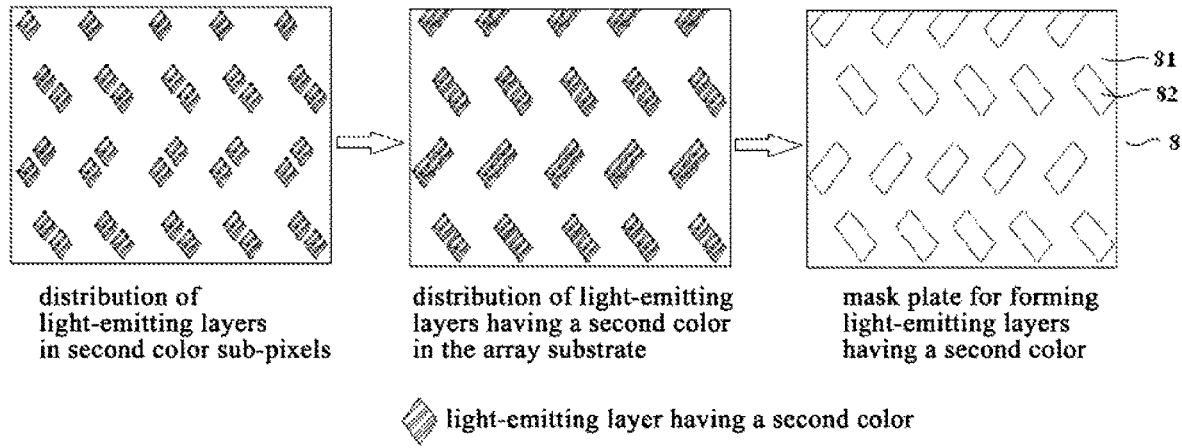
FIG. 4 are structural schematic diagrams of light-emitting layers having a second color in an array substrate and a corresponding mask plate provided by an embodiment of the present invention.

As shown in FIGS. 3 and 4, when forming the light-emitting layers by way of evaporation, the light-emitting layers (each at least includes an electroluminescent layer, and may also include other layer(s)) in the above-described sub-pixels adjacent to each other and having the same color may be formed through one opening 82 in the mask plate, and thus, the size of the light-emitting layer of each sub-pixel may be decreased to be a half of the original size thereof without changing the size of the opening 82, thereby improving the resolution. In this case, all or a part of the layers of the light-emitting layers of the two sub-pixels are respectively connected as a whole, but because the OLEDs of the two sub-pixels have separated driving circuits and a pixel define layer are provided therebetween, the two sub-pixels can still display independently.

Meanwhile, the above-described arrangement manner of sub-pixels also facilitates improving display effect and visual resolution under the circumstance that the sub-pixels have the same sizes as those in the prior art.

In one embodiment, there are some first type sub-pixels, each of which has the same color as one first type sub-pixel in adjacent row and adjacent column thereof, and no second type sub-pixel is provided between the two first type sub-pixels.

That is to say, besides the first type sub-pixel and the second type sub-pixel, some first type sub-pixels also satisfy the condition of being adjacent to each other and having the same color, and therefore, their light-emitting layers may also be prepared through one opening 82 in the mask plate. Needless to say, in this case, it is also required that no second type sub-pixel is provided between the two first type sub-pixels, otherwise the light-emitting layers of the two sub-pixels will overlap with the light-emitting layer of the second type sub-pixel. Specifically, as shown in FIG. 2, for two first type sub-pixels with coordinates (M3, S1) and (M2, S2), both have the first color, rows and columns in which the two sub-pixels are respectively located are adjacent, no second type sub-pixel is provided between them, and thus the two first type sub-pixels are the above-described sub-pixels adjacent to each other and having the same color; whereas for two first type sub-pixels with coordinates (M1, S2) and (M2, S3), both have the same color, but the second type sub-pixel with coordinates (N1, P2) is provided between them, and therefore, the two first type sub-pixels do not satisfy the requirement of being adjacent to each other and having the same color.

Thereinafter, a preferable array substrate provided by an embodiment of the present invention is described, and the array substrate includes a plurality of repetitive units 9 arranged in an array.

Figure 1:
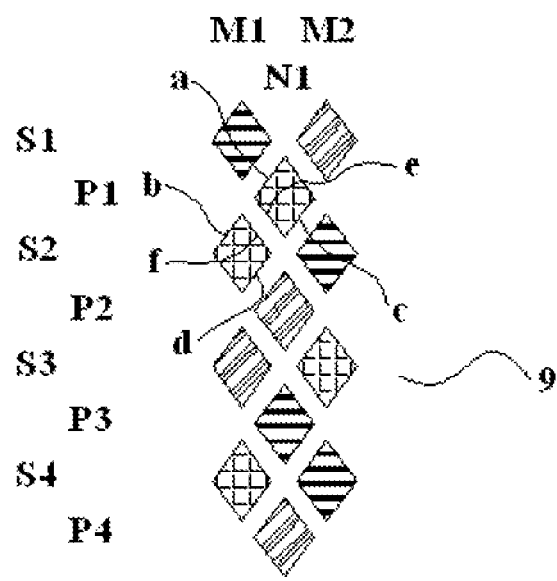
FIG. 1 is a structural schematic diagram of light-emitting layers in one repetitive unit of an array substrate provided by an embodiment of the present invention.

That is to say, as shown in FIGS. 1 and 2, the array substrate may also be considered to be formed by arranging a plurality of the same repetitive units 9, and each repetitive unit 9 has the same structure and includes a plurality of sub-pixels arranged in a certain manner.

The sub-pixels in the entire array substrate are arranged in a regular manner, which facilitates preparation and driving.

Specifically, each repetitive unit 9 comprises eight first type sub-pixels and four second type sub-pixels, and these sub-pixels are arranged in the following manner:

| first type sub-pixel | | first type sub-pixel |
|---|---|---|
| | second type sub-pixel | |
| first type sub-pixel | | first type sub-pixel |
| | second type sub-pixel | |
| first type sub-pixel | | first type sub-pixel |
| | second type sub-pixel | |
| first type sub-pixel | | first type sub-pixel |
| | second type sub-pixel. | |

That is to say, as shown in FIG. 1, eight first type sub-pixels are included in each repetitive unit 9 and are arranged in four rows and two columns; four second type sub-pixels are included in the repetitive unit 9, and the four second type sub-pixels are arranged in one column and located between two columns of first type sub-pixels. In this manner, as shown in FIG. 2, in the entire array substrate, no second type sub-pixels are arranged between two adjacent columns of first type sub-pixels that are respectively in two adjacent repetitive units 9 (e.g., between the first type sub-pixels in column M2 and the first type sub-pixels in column M3).

As shown in FIG. 2, the 12 sub-pixels included in the above-described repetitive unit 9 are classified into four first color sub-pixels, four second color sub-pixels and four third color sub-pixels; and in the array substrate, among the sub-pixels in the same column, sub-pixels having the same color are not adjacent; and among the sub-pixels in the same row, sub-pixels having the same color are not adjacent.

Specifically, in the case of RGB mode, sub-pixels in the array substrate are equally divided into sub-pixels of three colors, namely, red sub-pixels, green sub-pixels and blue sub-pixels; in the entire array substrate, among the sub-pixels (including the first type sub-pixels and second type sub-pixels) in the same row or column, the condition in which sub-pixels having the same color are adjacent does not exist. Such arrangement helps to increase occurrence of the above-described condition of being adjacent to each other and having the same color.

Of course, it should be understood that, the "first color sub-pixels, second color sub-pixels and third color sub-pixels" herein only represents three kinds of sub-pixels having different colors, but not necessarily correspond to the above red sub-pixels, green sub-pixels and blue sub-pixels. Moreover, the sub-pixels of the array substrate do not necessarily have only three colors, and may be in other modes (e.g., RGBW mode, RGBY mode, etc.); the number, arrangement manner, etc. of the sub-pixels in the repetitive unit 9 may vary with the color mode of the sub-pixels, which is not described in detail herein.

In one embodiment, in each repetitive unit 9, the first color sub-pixels, the second color sub-pixels and the third color sub-pixels are arranged in the following manner:

| first color sub-pixel | | second color sub-pixel |
|---|---|---|
| | third color sub-pixel | |
| third color sub-pixel | | first color sub-pixel |
| | second color sub-pixel | |
| second color sub-pixel | | third color sub-pixel |
| | first color sub-pixel | |
| third color sub-pixel | | first color sub-pixel |
| | second color sub-pixel. | |

That is to say, colors of the sub-pixels in each repetitive unit 9 are preferably arranged in the manner shown in FIG. 1. The array substrate formed in this arrangement manner may be as shown in FIG. 2.

Of course, it should be understood that, the above arrangement merely represents relative position of the sub-pixels in the repetitive unit 9, instead of absolute positon thereof, and therefore, equivalent variants thereof also fall into the protection scope of the present invention. For example, when the repetitive unit is flipped horizontally (for example, the column M1 and the column M2 in the repetitive unit are exchanged in position) or flipped vertically (for example, the column N1 in the repetitive unit is shifted up as a whole), the resulting arrangement is substantially the same as the above-described arrangement. Alternatively, if a different part of the array substrate is chosen to serve as the repetitive unit, the repetitive unit is still substantially the same, as long as the arrangement manner of the sub-pixels in the resulting array substrate remains unchanged. For example, if the sub-pixels in columns N1, M2 and M3 in FIG. 2 are chosen as the repetitive unit, although it looks like that the second type sub-pixels in the repetitive unit are located on the edge, the resulting repetitive unit is substantially the same as the present repetitive unit.

In one embodiment, as shown in FIG. 2, projection of the light-emitting layer of each second type sub-pixel along the column direction is partially overlapped with projections, along the column direction, of the light-emitting layers of two columns of first type sub-pixels adjacent to said second type sub-pixel, respectively; and projection of the light-emitting layer of each second type sub-pixel along the row direction is partially overlapped with projections, along the row direction, of the light-emitting layers of two rows of first type sub-pixels adjacent to said second type sub-pixel, respectively.

That is to say, if the light-emitting layer of each sub-pixel is projected along the row direction (i.e., the light-emitting layer is projected to the column direction), for the light-emitting layer of every second type sub-pixel, its projection necessarily partially overlaps with projections of the light-emitting layers of the two first type sub-pixels that are respectively located on the upper and lower sides of the second type sub-pixel, respectively; correspondingly, if the light-emitting layer of each sub-pixel is projected along the column direction (i.e., the light-emitting layer is projected to the row direction), for the light-emitting layer of every second type sub-pixel, its projection necessarily partially overlaps with projections of the light-emitting layers of the two first type sub-pixels that are respectively located on the left and right sides of the second type sub-pixel, respectively.

In this way, the light-emitting layer of the second type sub-pixel partially overlaps with, but not arranged "separately" from, the light-emitting layers of the first type sub-pixels in both row and column directions. As such, as shown in FIG. 2, the area of the array substrate can be fully utilized, which further improves the resolution.

In one embodiment, the light-emitting layer is in the shape of a parallelogram, and each side of the parallelogram is inclined with respect to the row and column directions (that is, each side of the parallelogram is neither parallel nor perpendicular to the row or column direction).

That is to say, as shown in FIG. 2, the light-emitting layer is in the shape of a parallelogram, and the sides thereof are inclined, instead of being parallel to the row or column direction as in the prior art, and such manner facilitates implementing the above arrangement that the light-emitting layers "partially overlap" in the row and column directions.

In one embodiment, the light-emitting layer of each second type sub-pixel has two opposite sides, and the two opposite sides are respectively in the same lines as two opposite sides of the light-emitting layer of the first type sub-pixel having the same color as and adjacent to said second type sub-pixel.

That is to say, for the light-emitting layers of the above-described sub-pixels adjacent to each other and having the same color, two pairs of opposite sides in the light-emitting layers are parallel to each other, and are respectively in two lines. For example, as shown in FIG. 1, the second type sub-pixel with coordinates (N1, P1) and the first type sub-pixel with coordinates (M1, S2) are adjacent to each other and have the same color, and the upper left side a of the light-emitting layer of the second type sub-pixel with coordinates (N1, P1) and the upper left side b of the light-emitting layer of the first type sub-pixel with coordinates (M1, S2) are in the same line (of course, are also parallel), while the lower right side c of the light-emitting layer of the second type sub-pixel with coordinates (N1, P1) and the lower right side d of the light-emitting layer of the first type sub-pixel with coordinates (M1, S2) are in the same line. In this case, when using one opening 82 in the mask plate to form the light-emitting layers of the two sub-pixels, two opposite sides of said opening 82 are lines parallel to each other, which facilitate processing and implementation.

In one embodiment, one side of the light-emitting layer of each second type sub-pixel is opposite to one side of the light-emitting layer of the first type sub-pixel having the same color as and adjacent to said second type sub-pixel, and the two sides are parallel to each other and have the same length.

That is to say, for the light-emitting layers of the above-described sub-pixels adjacent to each other and having the same color, they necessarily have one pair of sides which are opposite, and preferably, the two sides are parallel to each other and have the same length. For example, as shown in FIG. 1, for the light-emitting layer of the second type sub-pixel with coordinates (N1, P1), the lower left side e thereof is opposite to the upper right side f of the light-emitting layer of the first type sub-pixel with coordinates (M1, S2), and the two sides e and f are parallel to each other and have the same length.

In one embodiment, all of the light-emitting layers are in the shape of rhombuses (i.e., the sides of each light-emitting layer have the same length), and each rhombus has one pair of sides parallel to a first direction and the other pair of sides parallel to a second direction.

That is to say, as shown in FIG. 2, all light-emitting layers may be in the shape of rhombuses having the same size, corresponding sides of the rhombuses are parallel to each other, and thus, distribution density of the light-emitting layers throughout the array substrate is maximized and most regular, which facilitates, to a largest extent, combination of openings 82 in the mask plate.

Of course, since the above-described light-emitting layer is only a part of the sub-pixel, the shape and size of the sub-pixel may be different from those of the light-emitting layer (for example, may be larger than the light-emitting layer).

Meanwhile, for the above-described array substrate, the display methods thereof are various. For example, every three sub-pixels having different colors and arranged in a triangle may serve as one "pixel" to display; alternatively, the array substrate may be divided into mesh-shaped according to the manner shown in FIG. 2, display is performed by "sharing sub-pixels" according to area ratio among light-emitting layers having different colors that are divided into each cell of the mesh; the specific display methods are various and are not described in detail herein.

Of course, it should be understood that, the form of the repetitive unit 9, the shape of the light-emitting layer and the like described above are not intended to limit the present invention.

This embodiment further provides a mask plate for forming light-emitting layers in the above-described array substrate by way of evaporation, the mask plate includes a plate body 81 provided with a plurality of openings 82, the plurality of openings 82 are configured to correspond to positions of the light-emitting layers of sub-pixels having the same color in the above-described array substrate, and the light-emitting layers of two sub-pixels having the same color and adjacent to each other correspond to one opening 82.

That is to say, each mask plate is configured to form the light-emitting layers of the sub-pixels having a certain color in the above-described array substrate. Specifically, the mask plate is a metal sheet (plate body 81), and a plurality of openings 82 are provided on the plate body 81, each opening 82 corresponds to "one piece of" light-emitting layer of the sub-pixels having the certain color, and therefore, for the light-emitting layers (at least electroluminescent layers) of the above-described two sub-pixels adjacent to each other and having the same color, only one opening 82 needs to be provided in the mask plate. As described above, the light-emitting layer may include an electroluminescent layer and other layer(s), the mask plate described herein is at least used for forming the electroluminescent layer, and the other layer(s) may be manufactured by using the mask plate of the present invention or other mask plate.

Specifically, for the above-described preferable array substrate (i.e., the array substrate shown in FIG. 2), the light-emitting layers of the first color sub-pixels are distributed as shown in the left drawing in FIG. 3 (in the drawings, only the light-emitting layers that are actually configured to emit light are taken into account and light-emitting layers between different sub-pixels are not shown).

In the entire array substrate, the light-emitting layers of said color are distributed as shown in the middle drawing in FIG. 3, and the light-emitting layers of some adjacent sub-pixels are connected as a whole (here, the case in which all layers of the light-emitting layers are respectively connected as a whole is taken as an example). The light-emitting layer with a shorter length (e.g., the light-emitting layer in the second row) represents the light-emitting layers, which are connected as a whole, of the adjacent first type sub-pixel and second type sub-pixel, and the area thereof is twice the area of the light-emitting layer of a single sub-pixel. The light-emitting layer with a longer length (e.g., the light-emitting layer in the first row) represents the light-emitting layers, which are connected as a whole, of two adjacent first type sub-pixels, and the area thereof is triple the area of the light-emitting layer of a single sub-pixel (corresponds to two sub-pixels and one blank sub-pixel).

Accordingly, the mask plate for forming the light-emitting layer having said color by way of evaporation is as shown in the right drawing in FIG. 3. It can be seen that, every opening 82 in the drawing corresponds to "one piece of" light-emitting layer, i.e., corresponds to the light-emitting layers of two sub-pixels. Therefore, under the circumstance that the size of the opening 82 remains unchanged, the size of the light-emitting layer of each sub-pixel can be decreased, i.e., the size of the sub-pixel can be decreased, and thus the resolution can be improved.

According to the above-described arrangement manner, as shown in FIG. 3, the openings 82 in different rows are inclined in different directions, and in this way, the following advantages can be achieved: in the process of evaporation, the mask plate needs to be fixed to a frame (i.e., it is required to "set a net"), and in order to prevent the mask plate from deforming and sagging because of gravity, the frame needs to apply certain pulling force onto the mask plate; the openings 82 inclined in different directions can make the stress distribution in the mask plate uniform, avoid stress concentration, and prevent the mask plate from being damaged or deformed by the pulling force.

Correspondingly, the light-emitting layers of the third color sub-pixels and the arrangement manner of the mask plate for the third color sub-pixels are similar to those of the first color sub-pixels, and are not described in detail herein.

The light-emitting layers of the second color sub-pixels and the arrangement manner of the mask plate for the second color sub-pixels are as shown in FIG. 4, which differ from those of the first color sub-pixels in that, the light-emitting layers which are connected as a whole are only located between the first type sub-pixel and the second type sub-pixel, and the case in which the light-emitting layers of two first type sub-pixels are connected as a whole does not exist, and therefore, the openings 82 of the mask plate for the second color sub-pixels are only inclined in different directions, but have the same size.

Of course, according to general technique requirements, the area and shape of the opening 82 are not necessarily exactly the same as those of the light-emitting layer, and in generally, the opening 82 needs to be slightly larger than its corresponding light-emitting layer. As the foregoing specific correspondence is known, it is not described in detail herein.

Embodiment 3

This embodiment provides a display device, which comprises any one of the above-described array substrates. The display device is an OLED display device, and may specifically be any product or member with a display function such as an electronic paper, a mobile phone, a tablet computer, a television, a display, a notebook computer, a digital photo frame, a navigator, or the like.

It could be understood that the above implementations are only exemplary implementations for illustrating the principle of the present invention, but the present invention is not limited thereto. Various variations and improvements can be made by those skilled in the art without departing from the spirit and essence of the present invention, and these variations and improvements are also considered to be within the protection scope of the present invention.

The invention claimed is:

1. An array substrate, comprising sub-pixels each having a light-emitting layer,
    the sub-pixels comprise a plurality of first sub-pixels arranged in an array having 2n columns and a plurality of second sub-pixels arranged in an array having n columns, n being an integer greater than 1, wherein the 2n columns of first sub-pixels are divided into n first-sub-pixel groups each including two adjacent columns of first sub-pixels, one column of second sub-pixels is disposed between the two adjacent columns of first sub-pixels in each first sub-pixel group such that every four first sub-pixels of the two columns in two adjacent rows are directly adjacent to one second sub-pixel of the one column of second sub-pixels by surrounding the one second sub-pixel, and the one second sub-pixel has the same color as one of the four first sub-pixels directly adjacent to the one second sub-pixel, and no sub-pixel is provided between two adjacent first-sub-pixel groups.

2. The array substrate according to claim 1, wherein for at least one set of two first sub-pixels, the two first sub-pixels are from two adjacent first-sub-pixel groups, have a same color and occupy two immediately consecutive rows and two immediately consecutive columns, respectively, and no second sub-pixel is provided directly between the two first sub-pixels.

3. The array substrate according to claim 2, wherein
projection of the light-emitting layer of each second sub-pixel along a column direction of the array is partially overlapped with projections, along the column direction of the array, of the light-emitting layers of each of first sub-pixels directly adjacent to said second sub-pixel; and
projection of the light-emitting layer of each second sub-pixel, except the second sub-pixel in the bottom row, along the row direction of the array is partially overlapped with projections, along the row direction of the array, of the light-emitting layers of first sub-pixels directly adjacent to said second sub-pixel.

4. The array substrate according to claim 3, wherein
the light-emitting layer is in the shape of a parallelogram, and each side of the parallelogram is inclined with respect to the row and column directions of the array.

5. The array substrate according to claim 4, wherein
the light-emitting layer of each second sub-pixel has two opposite sides, and the two opposite sides are respectively in the same lines with two opposite sides of the light-emitting layer of the first sub-pixel having the same color as and adjacent to the second sub-pixel.

6. The array substrate according to claim 5, wherein
all of the light-emitting layers are in the shape of rhombuses, and every rhombus has one pair of sides parallel to a first direction and the other pair of sides parallel to a second direction.

7. The array substrate according to claim 2, wherein each first-sub-pixel group and the one column of second sub-pixels disposed between the two adjacent columns of first sub-pixels in each first sub-pixel group are divided into a plurality of repetitive units arranged in one column, each repetitive unit comprises eight first sub-pixels arranged in four rows and two columns and four second sub-pixels arranged in four rows and one column, and each second sub-pixel except the bottom one of four second sub-pixels in one column is disposed between two adjacent first sub-pixels in a same column.

8. The array substrate according to claim 7, wherein in the array substrate,
among the sub-pixels in the same column, sub-pixels having a same color are not adjacent; and
among the sub-pixels in the same row, sub-pixels having a same color are not adjacent.

9. The array substrate according to claim 8, wherein the first sub-pixels include sub-pixels having three colors, the second sub-pixels include sub-pixels having the three colors, and in each repetitive unit, a number of sub-pixels having each of the three color is four.

10. The array substrate according to claim 9, wherein in each repetitive unit, four first sub-pixels in a first column are a first color sub-pixel, a third color sub-pixel, a second color sub-pixel and the third color sub-pixel, respectively, four first sub-pixels in a second column are the second color sub-pixel, the first color sub-pixel, the third color sub-pixel and the first color sub-pixel, respectively, and the four second sub-pixels in the one column are the third color sub-pixel, the second color sub-pixel, the first color sub-pixel and the second color sub-pixel, respectively.

11. The array substrate according to claim 1, wherein
projection of the light-emitting layer of each second sub-pixel along a column direction of the array is partially overlapped with projections, along the column direction of the array, of the light-emitting layers of each of first sub-pixels directly adjacent to said second sub-pixel; and
projection of the light-emitting layer of each second sub-pixel, except the second sub-pixel in the bottom row, along the row direction of the array is partially overlapped with projections, along the row direction of the array, of the light-emitting layers of first sub-pixels directly adjacent to said second sub-pixel.

12. The array substrate according to claim 11, wherein
the light-emitting layer is in the shape of a parallelogram, and each side of the parallelogram is inclined with respect to the row and column directions of the array.

13. The array substrate according to claim 12, wherein
the light-emitting layer of each second sub-pixel has two opposite sides, and the two opposite sides are respectively in the same lines with two opposite sides of the light-emitting layer of the first sub-pixel having the same color as and adjacent to the second sub-pixel.

14. The array substrate according to claim 13, wherein
all of the light-emitting layers are in the shape of rhombuses, and every rhombus has one pair of sides parallel to a first direction and the other pair of sides parallel to a second direction.

15. The array substrate according to claim 1, wherein each first-sub-pixel group and the one column of second sub-pixels disposed between the two adjacent columns of first sub-pixels in each first sub-pixel group are divided into a plurality of repetitive units arranged in one column, each repetitive unit comprises eight first sub-pixels arranged in four rows and two columns and four second sub-pixels arranged in four rows and one column, and each second sub-pixel except the bottom one of four second sub-pixels in one column is disposed between two adjacent first sub-pixels in a same column.

16. The array substrate according to claim 15, wherein in the array substrate,
among the sub-pixels in a same column, sub-pixels having the same color are not adjacent; and
among the sub-pixels in a same row, sub-pixels having the same color are not adjacent.

17. The array substrate according to claim 16, wherein the first sub-pixels include sub-pixels having three colors, the second sub-pixels include sub-pixels having the three colors, and in each repetitive unit, a number of sub-pixels having each of the three color is four.

18. The array substrate according to claim 17, wherein in each repetitive unit, four first sub-pixels in a first column are a first color sub-pixel, a third color sub-pixel, a second color sub-pixel and the third color sub-pixel, respectively, four first sub-pixels in a second column are the second color sub-pixel, the first color sub-pixel, the third color sub-pixel and the first color sub-pixel, respectively, and the four second sub-pixels in the one column are the third color sub-pixel, the second color sub-pixel, the first color sub-pixel and the second color sub-pixel, respectively.

19. A display device, comprising:
the array substrate according to claim 1.

* * * * *